United States Patent
Li et al.

(10) Patent No.: US 10,847,442 B2
(45) Date of Patent: Nov. 24, 2020

(54) INTERCONNECT ASSEMBLIES WITH THROUGH-SILICON VIAS AND STRESS-RELIEF FEATURES

(71) Applicant: Micron Technology, Inc., Boise, ID (US)

(72) Inventors: Hongqi Li, Boise, ID (US); Anurag Jindal, Boise, ID (US); Jin Lu, Boise, ID (US); Gowrisankar Damarla, Boise, ID (US); Shyam Ramalingam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 356 days.

(21) Appl. No.: 14/188,367

(22) Filed: Feb. 24, 2014

(65) Prior Publication Data

US 2015/0243583 A1    Aug. 27, 2015

(51) Int. Cl.
*H01L 23/48* (2006.01)
*H01L 21/768* (2006.01)
*H01L 23/367* (2006.01)

(52) U.S. Cl.
CPC ...... *H01L 23/481* (2013.01); *H01L 21/76897* (2013.01); *H01L 21/76898* (2013.01); *H01L 23/367* (2013.01); *H01L 21/7682* (2013.01); *H01L 21/76847* (2013.01); *H01L 2924/0002* (2013.01)

(58) Field of Classification Search
CPC ... H01L 29/0649; H01L 23/367; H01L 23/36; H01L 21/76847; H01L 21/76898; H01L 23/481; H01L 2225/06541; H01L 23/4821
See application file for complete search history.

(56) References Cited

U.S. PATENT DOCUMENTS

| | | | | |
|---|---|---|---|---|
| 8,742,590 B2* | 6/2014 | Beyne | ........... | H01L 21/764 257/773 |
| 8,778,194 B2* | 7/2014 | Reinmuth | ........... | H05K 13/00 216/18 |
| 8,962,474 B2* | 2/2015 | Yu | ........... | H01L 21/76898 257/774 |
| 9,024,390 B2* | 5/2015 | Miyajima | ........... | H01L 23/481 257/374 |
| 2005/0121768 A1* | 6/2005 | Edelstein | ........... | H01L 21/486 257/698 |
| 2010/0230818 A1* | 9/2010 | Birner | ........... | H01L 21/76898 257/751 |

(Continued)

OTHER PUBLICATIONS

International Search Report and Written Opinion dated May 29, 2015 in counterpart International Application No. PCT/US2015/016480, 14 pages.

*Primary Examiner* — Phat X Cao
(74) *Attorney, Agent, or Firm* — Perkins Coie LLP

(57) ABSTRACT

A semiconductor device in accordance with some embodiments includes a substrate structure and a conductive interconnect extending through at least a portion of the substrate structure. The conductive interconnect can include a through-silicon via and a stress-relief feature that accommodates thermal expansion and/or thermal contraction of material to manage internal stresses in the semiconductor device. Methods of manufacturing the semiconductor device in accordance with some embodiments includes removing material of the conductive interconnect to form the stress-relief gap.

17 Claims, 18 Drawing Sheets

(56) References Cited

U.S. PATENT DOCUMENTS

| | | |
|---|---|---|
| 2012/0013022 A1 | 1/2012 | Sabuncuoglu Tezcan et al. |
| 2012/0112361 A1 | 5/2012 | Han et al. |
| 2012/0139127 A1 | 6/2012 | Beyne et al. |
| 2012/0292746 A1 | 11/2012 | Lee et al. |
| 2012/0292782 A1* | 11/2012 | Lee ............... H01L 23/481 257/774 |
| 2013/0026645 A1* | 1/2013 | Mohammed ...... H01L 21/76898 257/774 |
| 2013/0115769 A1 | 5/2013 | Yu et al. |
| 2013/0127019 A1* | 5/2013 | Lee ............... H01L 25/0657 257/621 |
| 2013/0161825 A1* | 6/2013 | Hsu ............... H01L 21/76898 257/774 |
| 2013/0320554 A1* | 12/2013 | Barth ............ H01L 23/481 257/774 |
| 2013/0328186 A1* | 12/2013 | Uzoh ............. H01L 21/76898 257/737 |
| 2015/0035050 A1* | 2/2015 | Yeom ............. H01L 23/48 257/330 |

\* cited by examiner

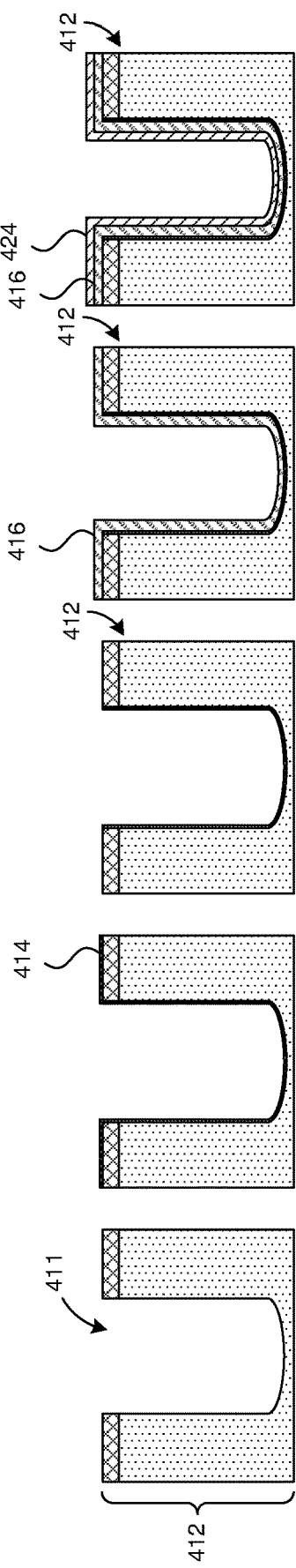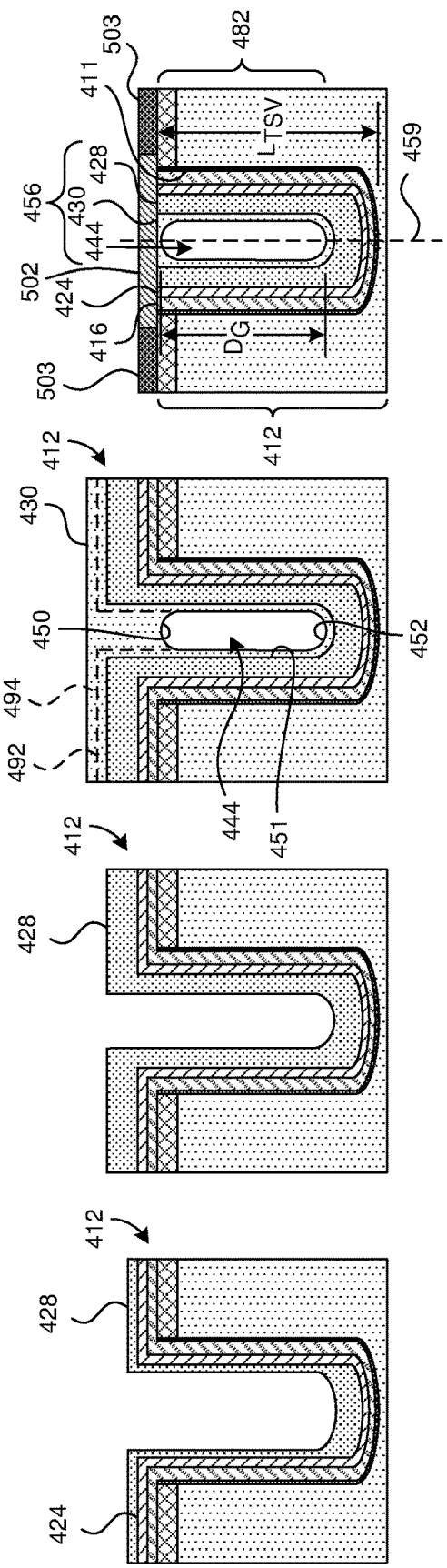

INTERCONNECT ASSEMBLIES WITH THROUGH-SILICON VIAS AND STRESS-RELIEF FEATURES

TECHNICAL FIELD

The present technology is related to interconnect assemblies for microelectronic devices and associated methods of manufacturing the same. In particular, the present technology is related to interconnect assemblies with through-silicon vias and features for accommodating thermal expansion and/or thermal contraction.

BACKGROUND

Conventional microelectronic devices often have through-silicon vias (TSVs) that electrically connect stacked semiconductor devices. TSVs can cause thermal-mechanical stresses in surrounding material of the semiconductor devices because conductive material (e.g., copper) of a TSV typically has a coefficient of thermal expansion (CTE) that is significantly greater than the CTE of surrounding material (e.g., silicon, silicon oxide, etc.). If TSVs are part of a microelectronic device that generates significant amounts of heat, the TSVs may cause damage to circuitry, which in turn leads to impaired performance of the device. At wafer-level processing, thermal processing can cause expansion/contraction of TSVs, which damages wafers or circuitry and results in significantly decreased product yields. Additionally, material microstructure changes might also lead to volume changes under relatively mild temperatures. For example, self-annealing of electro-chemically deposited copper films can cause such volume changes.

FIG. 1 is a schematic top plan view of an assembly 98 with a fractured substrate or wafer 100 ("wafer 100") and TSVs 102, 104. FIG. 2 is a schematic cross-sectional view of the assembly 98 taken along line 2-2 of FIG. 1. Each TSV 102, 104 can have a solid conductive core with a CTE that is greater than the CTE of the surrounding material of the wafer 100. For example, a copper core 122 can have a CTE of about $17 \times 10^{-6}$ m/m K and surrounding silicon can have a CTE of about $2.3 \times 10^{-6}$ m/m K. When the temperature of the assembly 98 is increased during processing, testing or operation, the TSVs 102, 104 expand and apply compressive forces (represented by arrows) to the surrounding material, such as an insulating material 105 and the silicon of the wafer 100. The compressive forces can cause normal compression and tangential tension in the wafer 100 and produce a crack 90 (FIG. 1). The crack 90 can be a surface crack or a crack that extends through a thickness t (FIG. 2) of the wafer 100. If the crack 90 is located on an active side 130 of the wafer 100, the crack 90 can break and prevent proper operation of circuitry 131 (FIG. 2). Additionally, circuitry performance (e.g., transistor performance) can be significantly impacted by proximity effects induced by thermal expansion/contraction of the TSVs 102, 104. For example, if a transistor is compressed or stretched by one or both TSVs 102, 104, the transistor may malfunction.

FIG. 3 is a schematic top plan view of an assembly 148 including a TSV 152 and a substrate or wafer 160 ("wafer 160"). When the temperature of the assembly 148 is decreased (e.g., after an annealing process), the TSV 152 can contract more than the surrounding material of the wafer 160 such that the TSV 152 applies tensile forces (represented by arrows) to the wafer 100. The tensile forces can cause normal tension and tangential compression in the surrounding material and produce a crack 150.

FIG. 4 is a schematic cross-sectional view of an assembly 168 including a substrate or wafer 170 ("wafer 170") and a TSV 172. When the temperature of the TSV 172 is increased, the TSV 172 experiences linear expansion and an end 176 of the TSV 172 moves from an initial position 177 to a protruded position 179 (illustrated in phantom line). This phenomenon is commonly referred to as "pumping" or "popping." After the TSV 172 is cooled, the end 176 may still protrude from the wafer 170 because of plastic deformation of the TSV 172. Pumping can cause damage to bond pads, wiring, circuits, interconnects, or other features vertically or laterally adjacent to the TSVs. Repeated heating and cooling (e.g., heating/cooling experienced in wafer processing or during normal use) can cause expansion and contraction which produces an undesirable interfacial crack 175.

BRIEF DESCRIPTION OF THE DRAWINGS

FIGS. 13A-13I are schematic cross-sectional views illustrating various stages in a method of manufacturing a semiconductor device in accordance with an embodiment of the present technology.

DETAILED DESCRIPTION OF TECHNOLOGY

Microelectronic devices can include vertical interconnects that electrically couple together structures. Microelectronic devices can include, without limitation, semiconductor structures (e.g., semiconductor dies or chips), substrates (e.g., substrates with circuitry, integrated circuits, TSVs, bond pads, etc.), microelectromechanical systems ("MEMS"), memory, and/or other electrical components. Vertical interconnects can include one or more features configured to manage internal stresses, if any, associated with thermal loading. In some embodiments, vertical interconnects can include TSVs with internal stress-relief features configured to inhibit, limit, or substantially prevent forces applied to surrounding material. A person skilled in the relevant art will understand that the present technology may have additional embodiments and that the present technology may be practiced without several of the details of the embodiments described below with reference to FIGS. 5-14.

Figure 1:
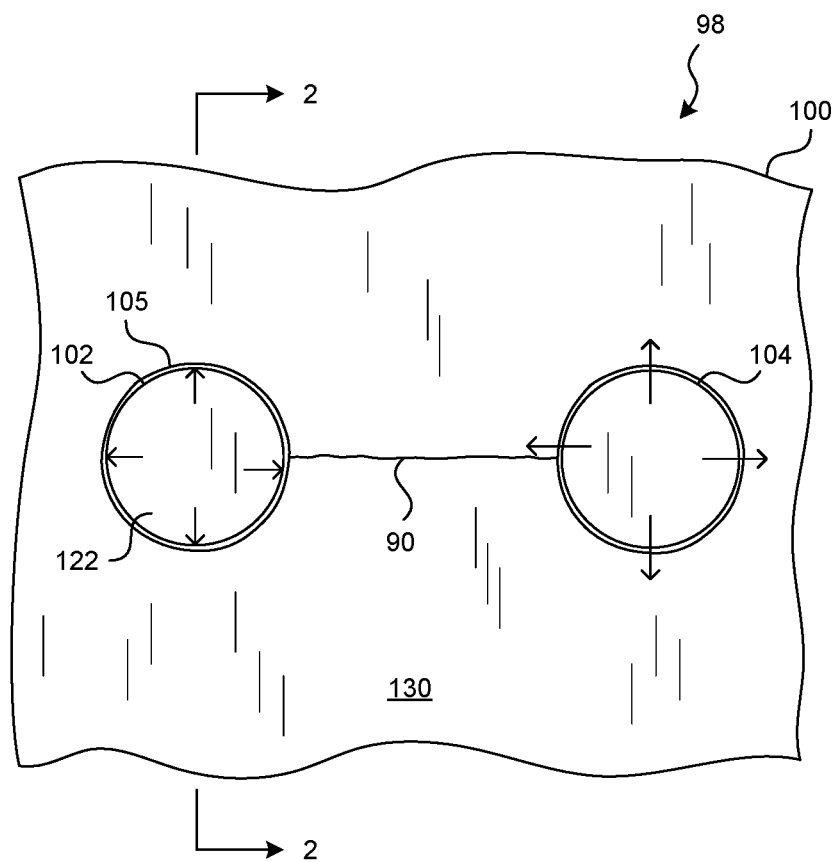
FIG. 1 is a schematic top plan view of an assembly with a damaged wafer and two TSVs in accordance with the prior art.
Figure 2:
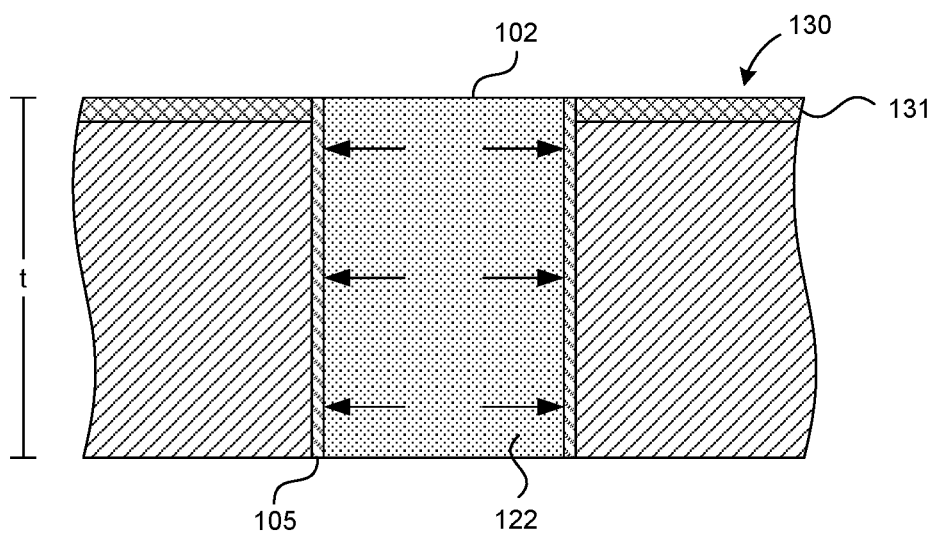
FIG. 2 is a schematic cross-sectional view of the assembly taken along line 2-2 of FIG. 1 in accordance with the prior art.
Figure 3:
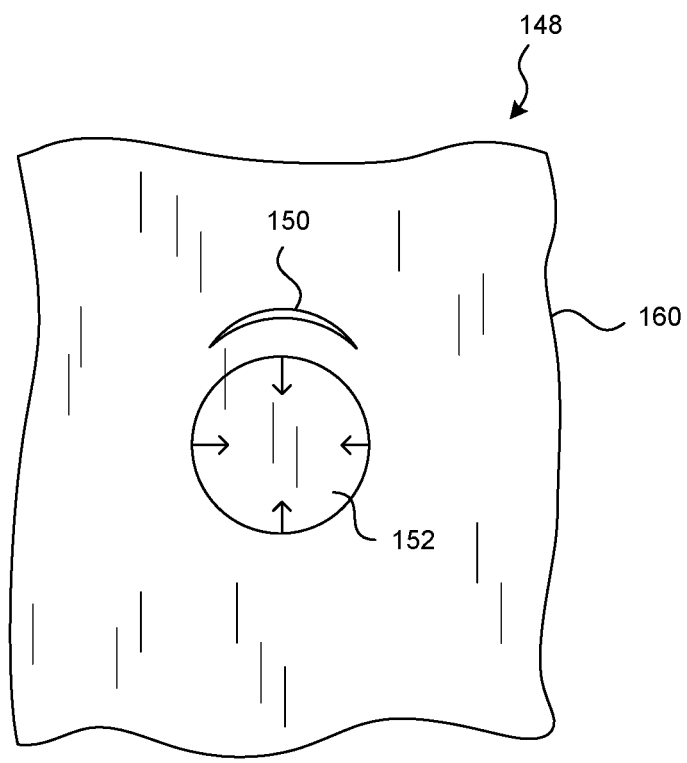
FIG. 3 is a schematic top plan view of a damaged wafer and a TSV in accordance with the prior art.
Figure 4:
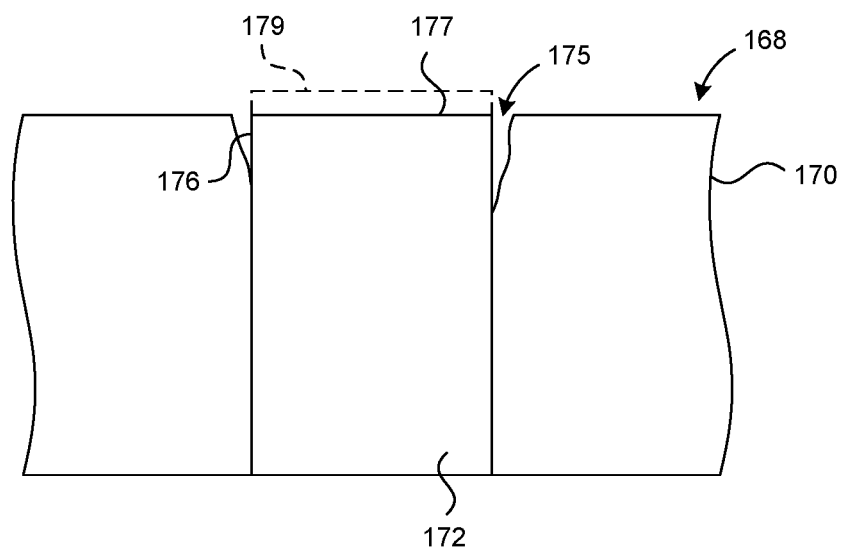
FIG. 4 is a schematic cross-sectional view of a damaged wafer and a TSV in accordance with the prior art.
Figure 5:
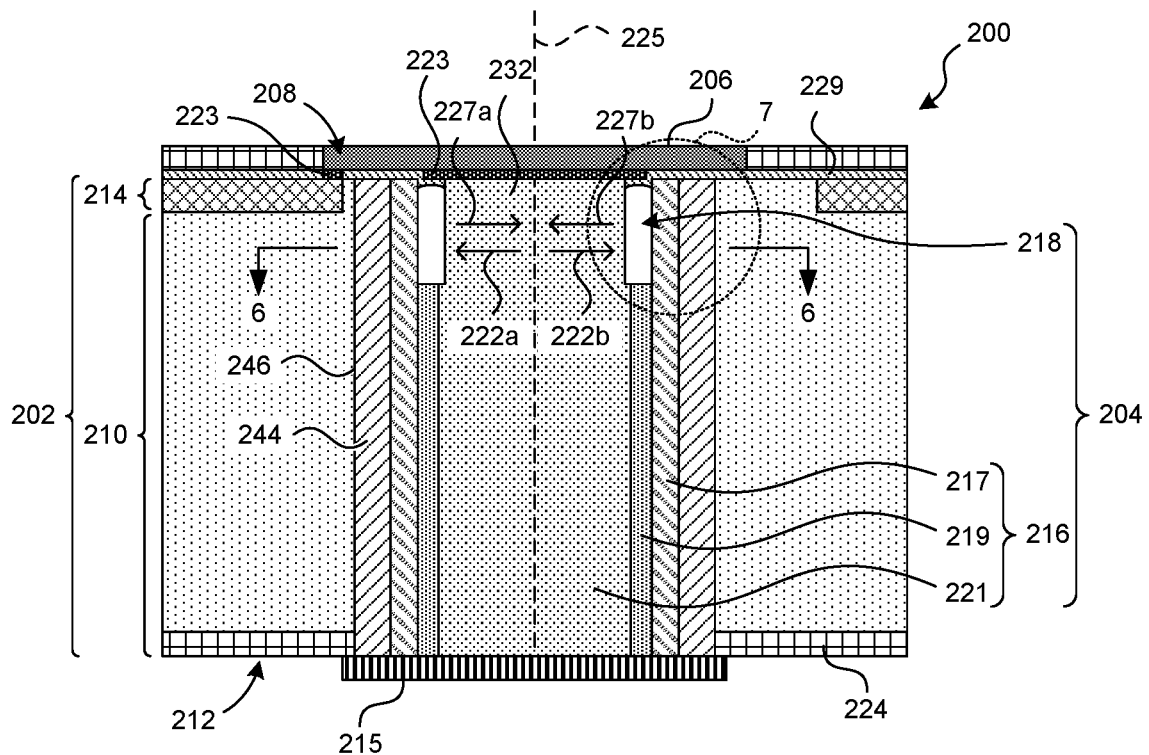
FIG. 5 is a schematic cross-sectional view of a semiconductor device with a TSV and a stress-relief feature in accordance with an embodiment of the present technology.
Figure 6:
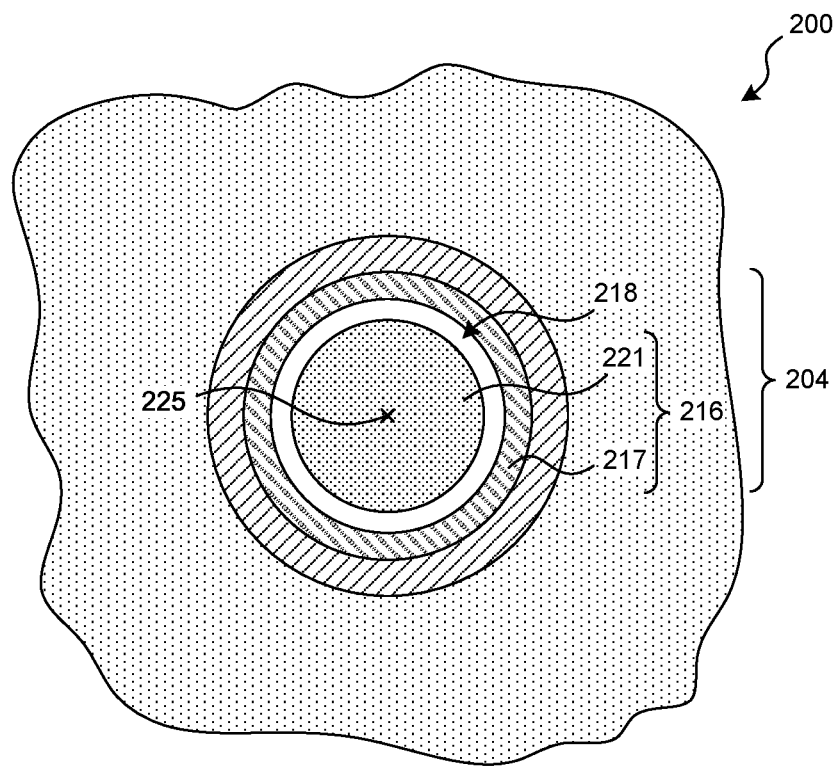
FIG. 6 is a schematic cross-sectional view of the semiconductor device taken along line 6-6 of FIG. 5 in accordance with an embodiment of the present technology.
Figure 7:
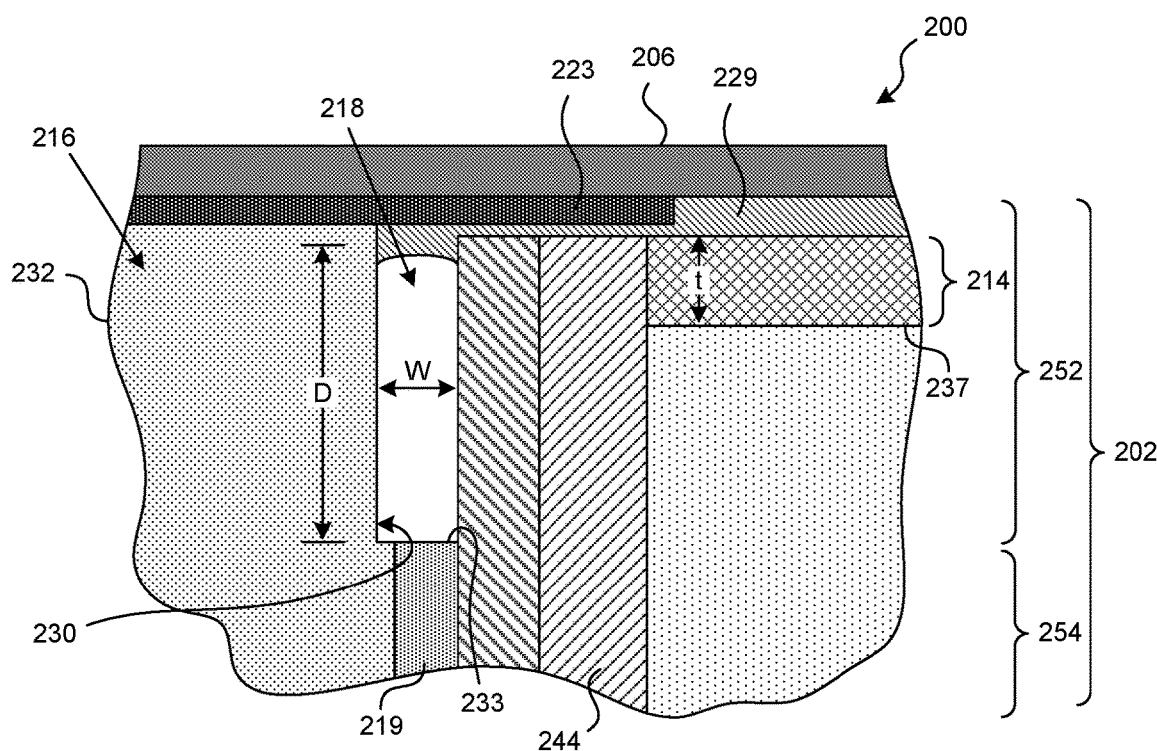
FIG. 7 is a detailed cross-sectional view of the stress-relief feature of FIG. 5 in accordance with an embodiment of the present technology.
Figure 8:
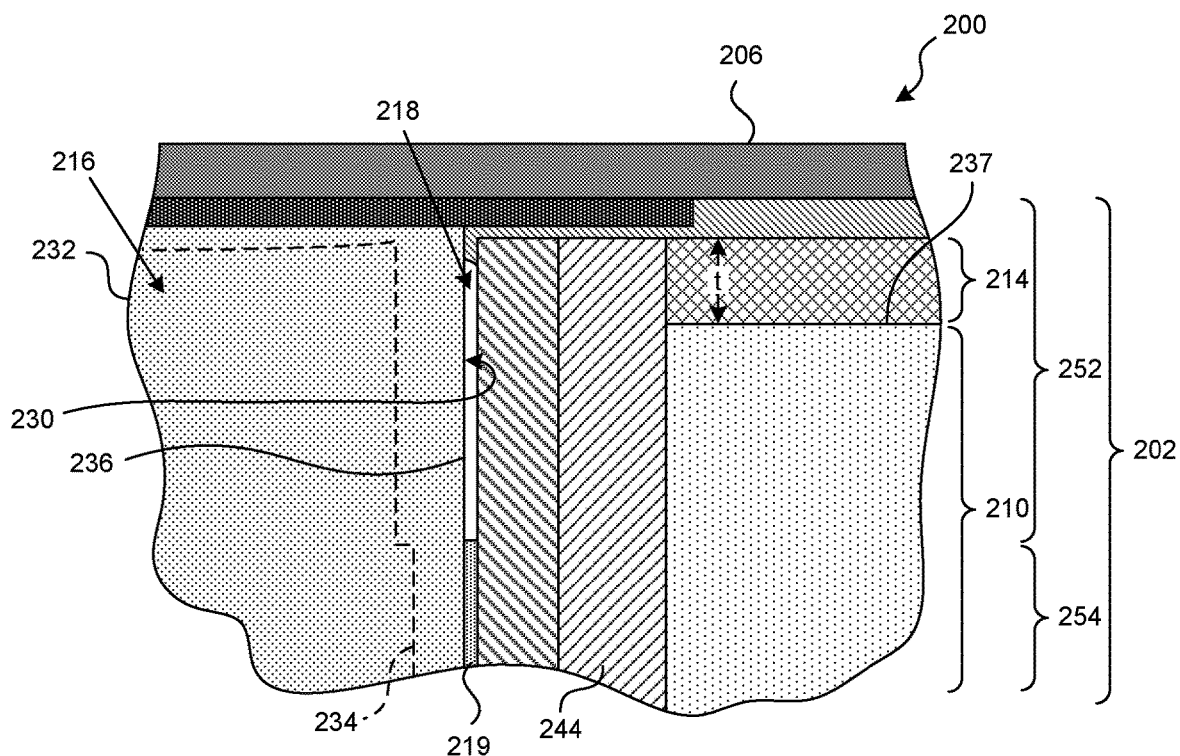
FIG. 8 is a schematic cross-sectional view of the stress-relief feature in a narrowed configuration in accordance with an embodiment of the present technology.
Figure 9:
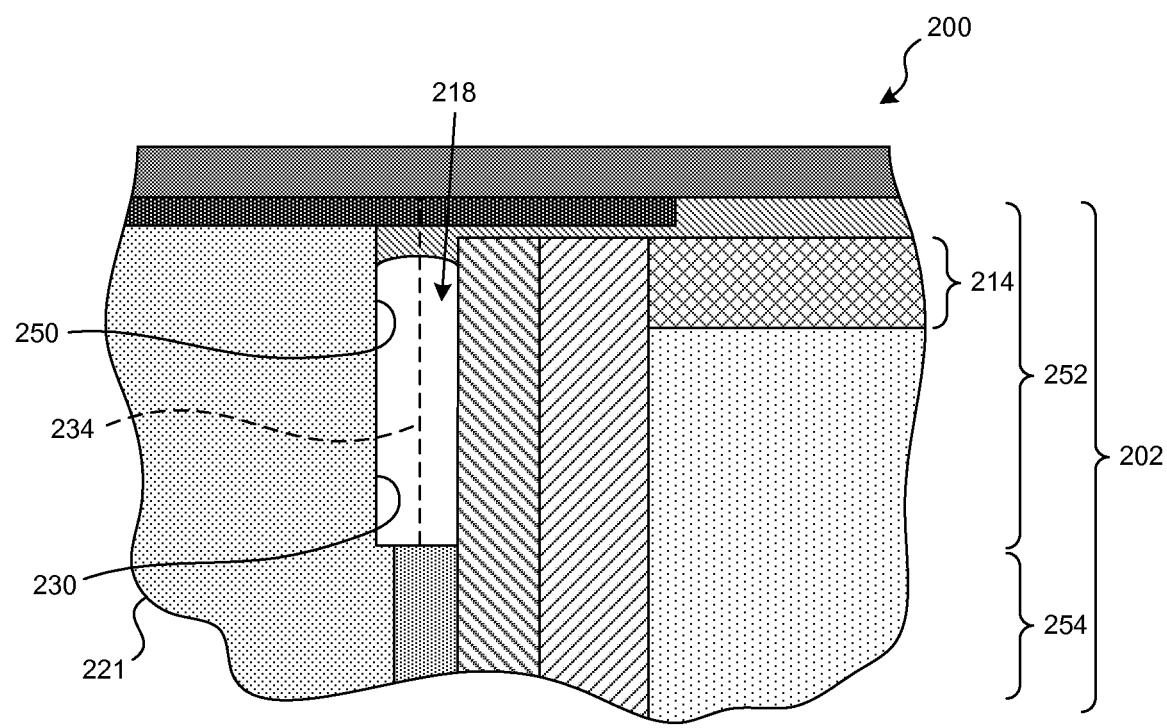
FIG. 9 is a schematic cross-sectional view of the stress-relief feature in a widened configuration in accordance with an embodiment of the present technology.

FIG. 5 is a cross-sectional view of a semiconductor device 200 ("device 200"). FIG. 6 is a schematic cross-sectional view of the device 200 taken along line 6-6 of FIG. 5. Referring to FIG. 5, the device 200 can include a substrate structure 202, a vertical interconnect 204 ("interconnect 204"), and a cap structure 206 (e.g., a continuous or a segmented frontside bond pad). The substrate structure 202 can have a first or front side 208 with circuitry 214 and a second or back side 212 with a backside feature 215 (e.g., a backside bond pad) separated from a wafer substrate by a dielectric material 224. The circuitry 214 can be electrically coupled to the bond pad 206 by the interconnect structure 223 in the form of a metal via. In certain embodiments, the interconnect structure 223 (e.g., a continuous or a segmented TSV interconnect) can be between the cap structure 206 and the core 221 and can cover the TSV, and such structure 223 can extend, to some extent, beyond a sidewall 246, as shown in FIGS. 7, 8 and 9. The interconnect 204 can electrically couple the circuitry 214 to the backside feature 215 and can include a through-silicon via 216 (TSV 216) and a stress-relief feature 218. The TSV 216 can include an outer material 217, a spacer material 219, and an inner material forming a core 221, and the stress-relief feature 218 can be a void or gap between the outer material 217 and the core 221.

Referring to FIGS. 5 and 6, the stress-relief feature 218 can circumferentially extend around the core 221 and can be configured to minimize or limit thermal stresses in the semiconductor device 200 by, for example, accommodating thermal expansion/contraction of material of the TSV 216. In some embodiments, the stress-relief feature 218 can accommodate lateral expansion (indicated by arrows 222a, 222b in FIG. 5) of the core 221 to inhibit, limit, or substantially eliminate crack initiation and crack propagation (e.g., stable radial crack propagation, unstable radial crack propagation, or both). Additionally or alternatively, the stress-relief feature 218 can accommodate lateral contraction (indicated by arrows 227a, 227b in FIG. 5) of the core 221 to inhibit, limit, or substantially eliminate crack initiation and circumferential crack propagation. The stress-relief feature 218 can inhibit linear expansion of the core 221 to inhibit, limit, or substantially eliminate interfacial cracking and/or TSV pumping. As such, compression or stretching of transistors, separation of adjacent interconnects, debonding/delamination, and/or other proximity effects can also be reduced or limited. Thus, the stress-relief feature 218 can avoid one or more of the problems discussed in connection with FIGS. 1-4.

FIG. 7 is a detailed view of the stress-relief feature 218 when the device 200 is at room temperature. FIG. 8 shows the stress-relief feature 218 when the device 200 is at a relatively high temperature. FIG. 9 shows the stress-relief feature 218 when the device 200 is at a relatively low temperature. Referring now to FIG. 7, the TSV interconnect 223 extends across an upper end of the stress-relief feature 218 and can comprise copper, aluminum, gold, silver, and/or another conductive material to provide an electrical connection to the core 221. In some embodiments, the cap structure 206 can be a bond pad or other connection structure that covers and/or forms a closed chamber.

The stress-relief feature 218 is located between the outer material 217 and core 221 and is located between the etchable spacer material 219 and the next level inter-metal dielectric materials (e.g., capping material 229). However, the stress-relief feature 218 can be positioned at other locations suitable for managing thermal loading. A width W of the stress-relief feature 218 can be selected to accommodate lateral expansion of an end 232 of the core 221. For example, the width W can be sufficiently large to inhibit or prevent damage to the circuitry 214 and can be increased or decreased to increase or decrease, respectively, the amount of thermal expansion of the end 232 required to close the stress-relief feature 218. The stress-relief feature 218 can have a depth D equal to or greater than a thickness t of the circuitry 214. The ratio of the depth D to thickness t can be equal to or greater than 1, 2, 3, 4, or 5, but the ratio D/t can be different if needed or desired. The depth D can be increased to increase the thickness of a stress-relieved region 252, and to further localize the thermal stresses to an interior region 254 of the substrate 210, thereby reducing the likelihood of crack formation and/or growth along free surfaces of the semiconductor device 200. As such, the depth D and width W of the feature 218 can be increased or decreased to increase or decrease the size of the stress-relieved region 252. In some embodiments, a lower closed end 233 of the stress-relief feature 218 is deeper than a bottom 237 of the circuitry 214. The dimensions (e.g., depth D, width W, etc.) of the stress-relief feature 218 can be decreased to increase the size (e.g., diameter) of the core 221, thereby increasing the electrical conductivity of the TSV 216. The TSV 216 can have a solid cross-section along most of its longitudinal length to provide relatively high electrical conductivity. In some embodiments, including the illustrated embodiment of FIG. 7, the TSV 216 has a solid cross section, defined by conductive material, along most of its length. The spacer material 219 defines the closed end 233 and can comprise conductive material to enhance the electrical conductivity of the TSV 216.

As the temperature of the core 221 increases, the core 221 can expand in a radial or lateral direction (e.g., a direction generally perpendicular to a via axis 225 shown in FIG. 5), an axial direction (e.g., a direction substantially parallel to the via axis 225 shown in FIG. 5), or another direction. FIG. 8 shows the core 221 thermally expanded from an initial configuration 234 (illustrated in phantom line) to an expanded configuration 236. The narrowed stress-relief feature 218 of FIG. 8 is partially closed to accommodate the thermal expansion to keep the internal stresses in the substrate structure 202 at or below an acceptable level. An outer surface 230 of the upper end 232 is spaced apart from a laterally adjacent region of the outer material 217. The substrate structure 202 can also expand toward the core 221. If the temperature of the core 221 is further increased, the stress-relief feature 218 can completely close and compressive forces can be applied to the outer material 217, via a liner or dielectric material 244 ("dielectric liner material 244"), and substrate structure 202. However, applied compressive forces will be limited because of the amount of thermal expansion required to completely close the stress-relief feature 218, thereby keeping internal stresses, if any, in the region 252 sufficiently low to inhibit or prevent cracking.

As the temperature of the core 221 decreases, the core 221 can contract in the radial or lateral direction, axial direction, or other directions. For example, the outer surface 230 can move away from the adjacent region of the outer material 217, thereby widening the stress-relief feature 218. The stress-relief feature 218 can be further widened by contraction of the substrate structure 202. FIG. 9 shows the core 221 contracted from the initial configuration 234 (illustrated in phantom line) to a contracted position 250 when the semiconductor device 200 is cooled. The substrate structure 202 can also contract and move away from the core 221. The stress-relief feature 218 can help keep the internal stresses, if any, in the region 252 sufficiently low to inhibit or prevent cracking, such as the circumferential cracking discussed in connection with FIG. 3 and/or the interfacial cracking discussed in connection with FIG. 4.

FIGS. 10A-10H are schematic cross-sectional views illustrating various stages in a method of manufacturing a semiconductor device in accordance with an embodiment of the present technology. Generally, an opening is formed in or through the substrate structure 202, and a conductive material is deposited into the opening to form the TSV 216. The stress-relief feature 218 can be formed by selectively removing material from the TSV 216. In some embodiments, the dimensions of the stress-relief feature 218 can be controlled using film deposition techniques and selecting etch parameters. After forming the stress-relief feature 218, the dielectric of the next interconnect level is deposited to seal the empty chamber. Details of the stages are discussed in connection with FIGS. 10A-10H.

Figure 10A:
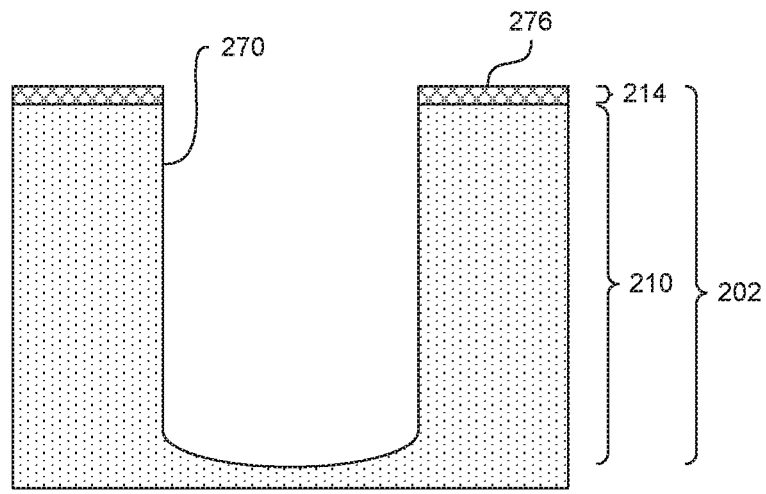
FIGS. 10A-10H are schematic cross-sectional views illustrating various stages in a method of manufacturing a semiconductor device in accordance with an embodiment of the present technology.

FIG. 10A is a schematic cross-sectional view of the substrate structure 202 after an opening 270 has been formed through at least a portion of the substrate 210. Previously, the circuitry 214 can be formed by front-end-of-line processing and can include, without limitation, one or more circuits (e.g., integrated circuits), transistors, metal layers, interconnects, wires, or other electrical features. The substrate 210 can be a wafer (e.g., a silicon wafer) used to form part of a die, chip, memory device, microelectromechanical system (MEMS), or other semiconductor device. An etching process (e.g., dry etching, wet etching, etc.), drilling process (e.g., laser drilling) or other material removal process can be used to form the blind opening 270 having a desired depth and shape. The opening 270 can extend completely through the substrate 210 in some applications. The circuits can be protected by, for example, the capping material (e.g., a capping layer) during TSV hole formation through the capping layer 206 and hole formation deeply into the substrate 210. The capping material can be one or more layers of dielectric materials that are totally or partially removed during TSV metal isolation.

Figure 10B:
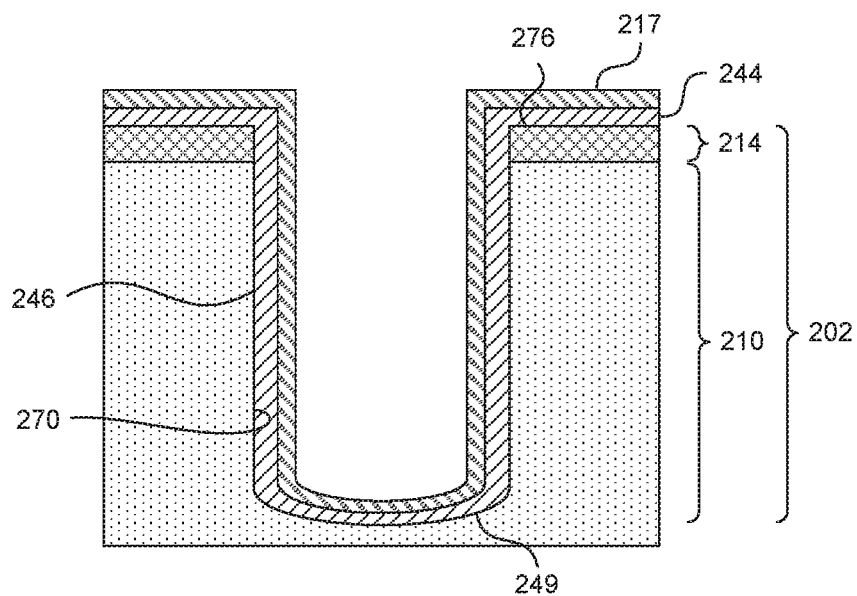

FIG. 10B is a schematic cross-sectional view of the substrate structure 202. The outer material 217 and a dielectric liner material 244 have been deposited onto the substrate structure 202. The dielectric liner material 244 is deposited on a bottom 249 and a sidewall 246 and on the upper surface 276 of the circuitry 214. The dielectric liner material 244 can include, without limitation, silicon oxide, silicon nitride, silicon carbide, or other dielectric material. The outer material 217 can be a seed/barrier structure having a barrier material and a seed material. The barrier material can include, without limitation, tantalum (Ta), tantalum nitride (TaN$_x$), tungsten (W), ruthenium (Ru), titanium (Ti), titanium nitride (TiN), or combinations thereof. The seed material can include, without limitation, copper (Cu), nickel (Ni), W, palladium (Pd), aluminum (Al), or combinations thereof. Chemical vapor deposition (CVD), atomic layer deposition (ALD), physical vapor deposition (PVD), sputtering, and/or other processes can be used to apply the dielectric liner material 244 and/or outer material 217.

Figure 10C:
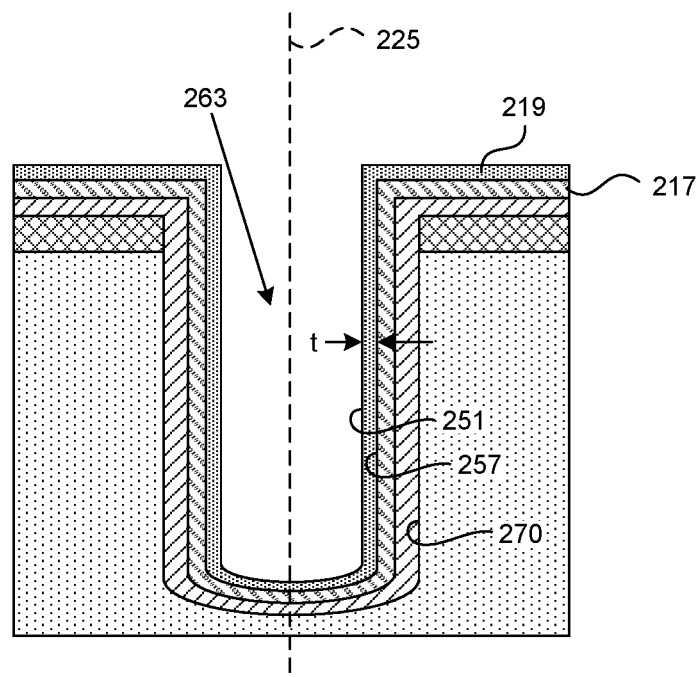

FIG. 10C is a schematic cross-sectional view of the substrate structure 202 after the spacer material 219 has been applied to the outer material 217. The spacer material 219 can comprise a selectively removable conductive material. The thickness t of the spacer material 219 can be selected based on the desired width W (FIGS. 7-9) of the stress-relief feature 218. The sidewall 251 of the spacer material 219 can be self-aligned with the via axis 225 because a sidewall 257 of the outer material 217 can be aligned with the via axis 225. A deposition process (e.g., CVD, ALD, etc.) can be used to consistently achieve a desired thicknesses t without using reticles, but sputtering, plating process (e.g., electroplating, electroless plating, etc.), or other techniques for applying material can also be used.

Figure 10D:
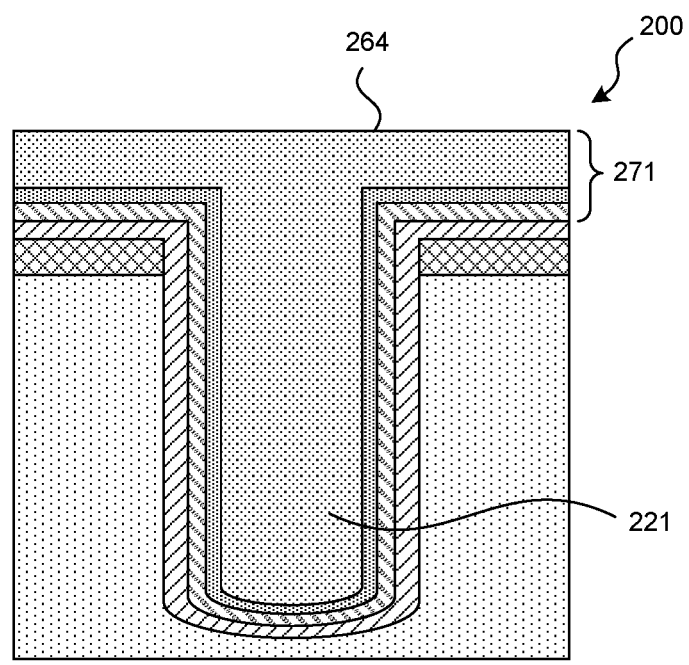

The spacer material 219 can define a cavity 263 that can be partially or completed filled with a conductive material 264. FIG. 10D is a cross-sectional view of the semiconductor device 200 after the cavity 263 has been completely filled with conductive material 264. The conductive material 264 can include, without limitation, copper (including copper alloys), gold, silver, nickel, tungsten, or combinations thereof, and can be applied by introducing the conductive material into an aperture or opening 280 (FIG. 10C) using CVD, PVD, plating processes, or other filling process. One filling process can include, for example, forcing a conductive paste into the cavity 263 and allowing the paste to solidify to form the solid core 221.

Material located outside of the via can be removed using, for example, a chemical-mechanical process (CMP), etching process, or other material removal process. In one embodiment, a slurry (e.g., a colloidal slurry) can be used to non-selectively remove selected materials 271. In another embodiment, multiple types of slurries are used on different platens to remove material and perform bulk polishing, clear polishing, or other processing. In one embodiment, a CMP process can stop on the dielectric liner material 244, or remove a significant amount of the dielectric liner material 244, or all exposed portion of the dielectric liner material 244.

Figure 10E:
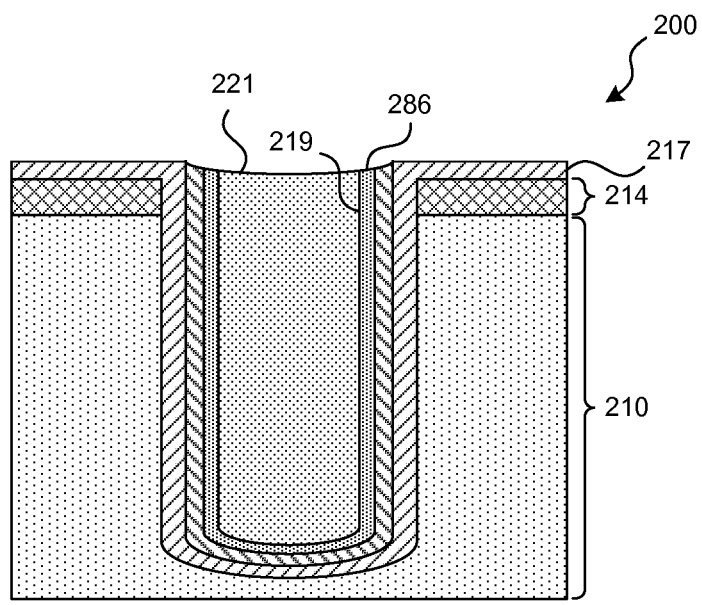
Figure 10F:
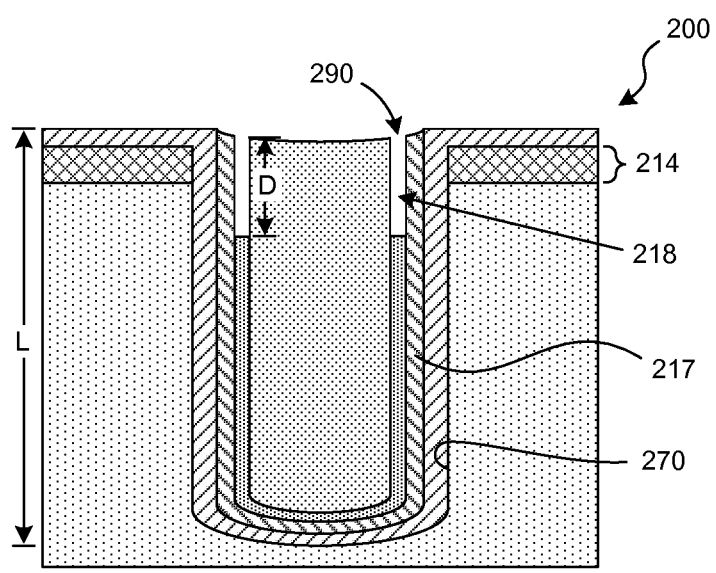

FIG. 10E is a schematic cross-sectional view of the semiconductor device 200 after removing the materials 271 (FIG. 10D), and FIG. 10F shows the semiconductor device 200 after forming the stress-relief feature 218. To form the stress-relief feature 218, an upper region 286 of the spacer material 219 can be exposed to an etchant to selectively etch the spacer material 219 without using reticles or other items that complicate the fabrication process. The outer material 217 can serve as a barrier layer to protect the circuitry 214 and/or substrate 210. The etch time can be increased or decreased to increase or decrease, respectively, the depth of the stress-relief feature 218. FIG. 10F shows the depth D of the stress-relief feature 218 equal to or less than half of the longitudinal length L of the opening 270. In certain embodiments, the depth D is equal to or less than about 10%, 20%, 30%, 40%, or 50% of the length L of the opening 270. Advantageously, dimensions of the stress-relief feature 218 (e.g., depth, width, etc.) can be controlled using film deposition techniques and selecting etch parameters (e.g., etch time) for relatively small TSVs (e.g., TSVs with diameters equal to or less than about 3 μm).

Figure 10G:
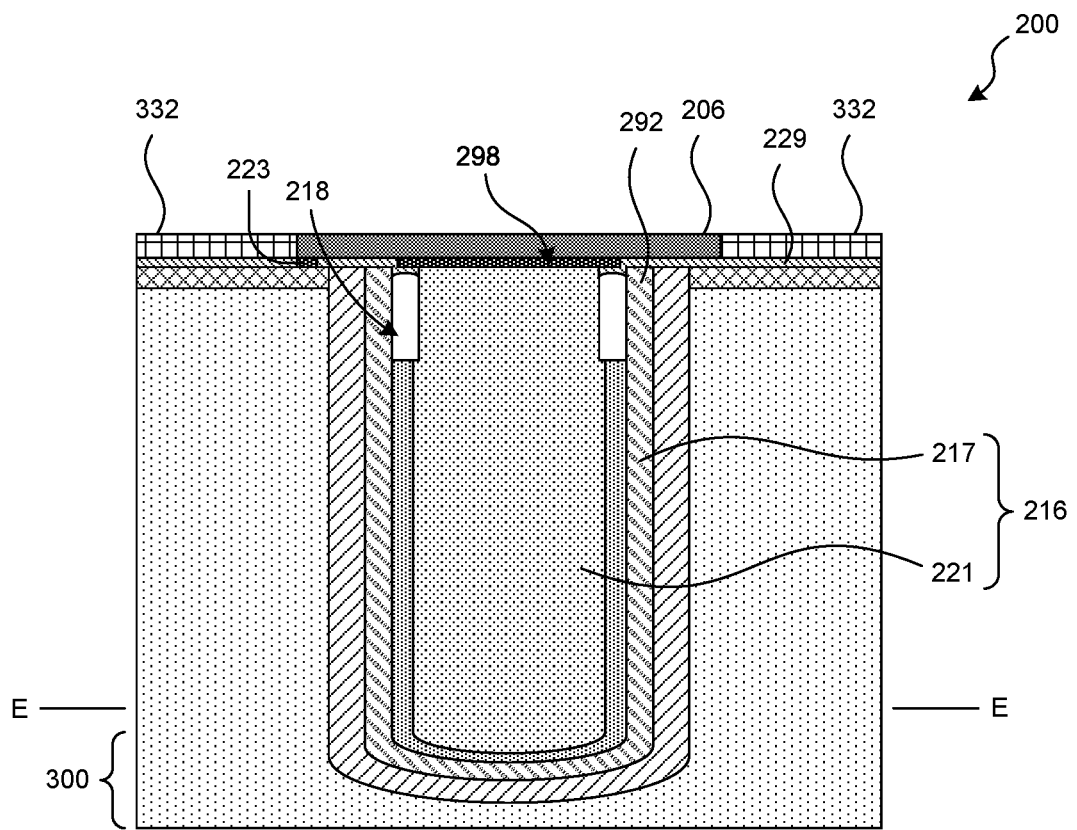
Figure 10H:
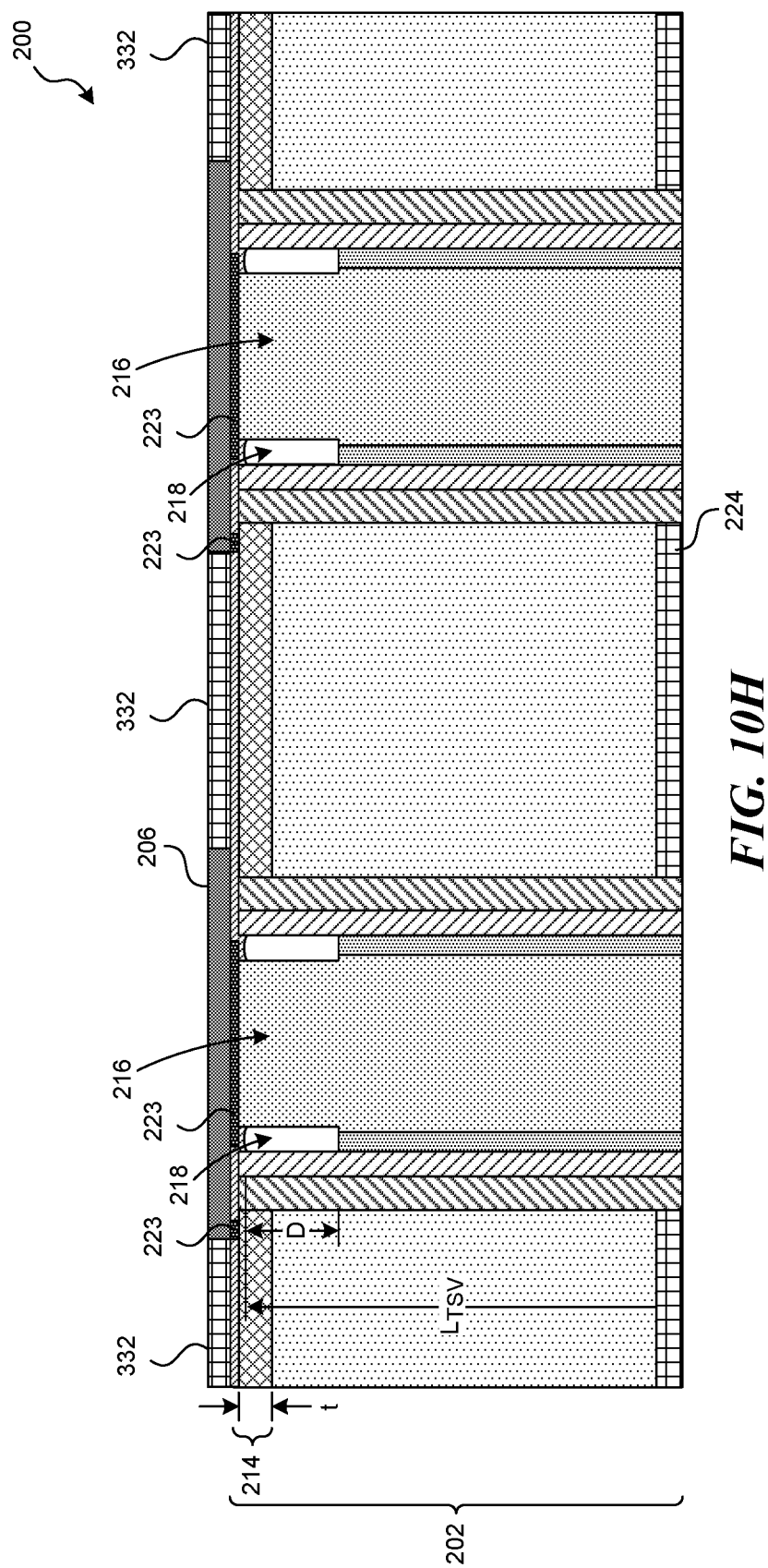

FIG. 10G is a schematic cross-sectional view of the semiconductor device 200 after the formation of metal vias 223 through the capping material interconnect dielectric 229 and after formation of the cap structure 206. The capping material interconnect dielectric 229 and/or cap structure 206 can be formed to cover an open end 290 (FIG. 10F) of the stress-relief feature 218. The cap structure 206 can extend across the dielectric liner material 244, an upper end 292 of the outer material 217, and an upper surface 298 of the core 221. The capping material interconnect dielectric 229 and/or cap structure 206 can hermetically seal the chamber 291, which can be under vacuum to avoid stresses caused by expansion of gas due to temperature changes. Dielectric material 332 can be located between adjacent cap structures 206, as shown in FIG. 10H. After forming the cap structure 206, the backside of the semiconductor device 200 can be processed to expose the TSV 216. In one embodiment, a CMP or grinding process can be used to remove a backside region 300 to an elevation E-E. Other conductive structures (e.g., bond pads, solder balls, or the like) can be formed in or on the passivation dielectric layer 224, which is deposited on the backside, to provide an electrical connection to the via 216. FIG. 10H, for example, shows the semiconductor device 200 after backside processing, and the stress-relief feature 218 can have a depth D generally equal to or greater than a thickness t of the circuitry 214.

The embodiment of the manufacturing process discussed in connection with FIGS. 10A-10H can be modified to produce cores and stress-relief features in a wide range of configurations. The core 221 of FIGS. 5-10H has a generally circular cross-sectional shape as viewed from above. However, the core 221 can have a noncircular cross-sectional shape (e.g., a polygonal shape, an elliptical shape, etc.) and the width W of the stress-relief feature 218 may be selected to compensate for different amounts of expansion/contraction. The stress-relief feature 218 can be a U-shaped channel/recess, V-shaped channel/recess, or other feature capable of absorbing dimensional changes of surrounding material. The dimensions of the stress-relief features can be selected to inhibit or prevent damage to semiconductor devices when the temperature of the semiconductor device is increased by at least about 100 Celsius, 200 Celsius, or 300 Celsius. For example, stress-relief features can be configured to accommodate thermal expansion/contraction when TSVs are heated from room temperature to temperatures equal to or greater than 300 Celsius for wafer processing (e.g., annealing).

Figure 11:
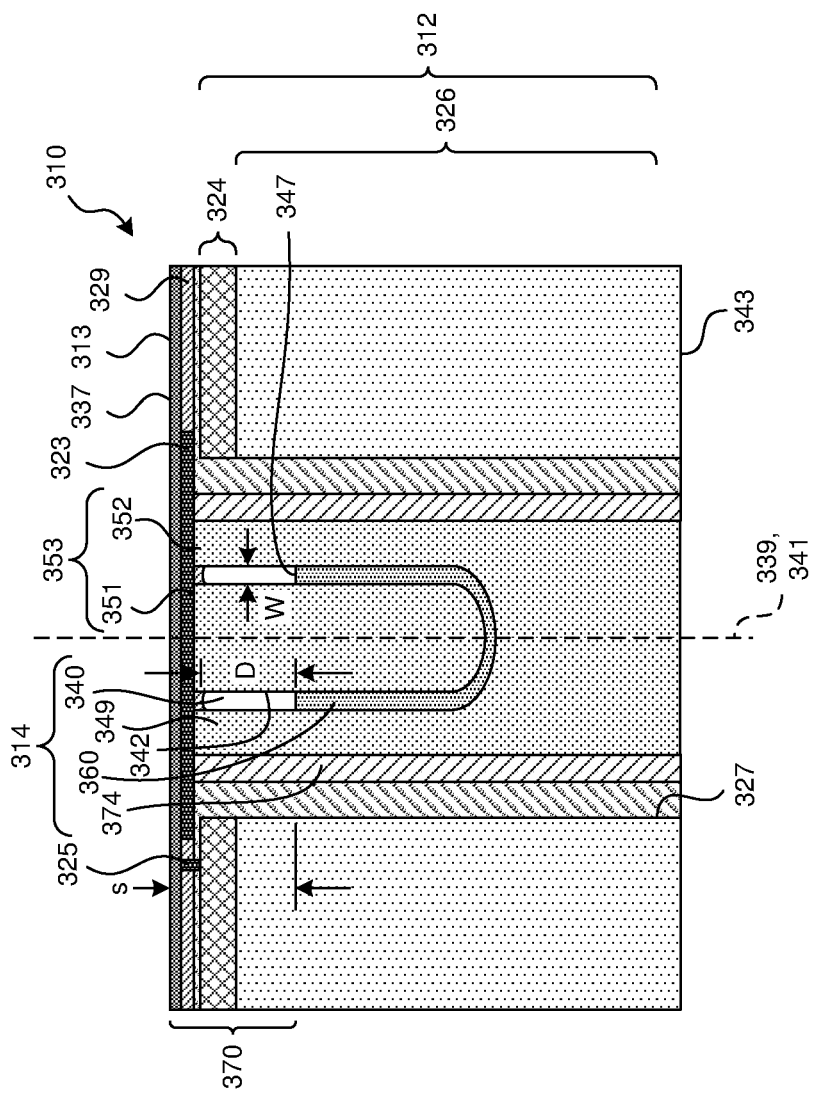
FIG. 11 is a cross-sectional view of a semiconductor device including a TSV and a stress-relief feature in accordance with an embodiment of the present technology.

FIG. 11 is a schematic cross-sectional view of a semiconductor device 310 that can include a substrate structure 312, vertical interconnect 314 ("interconnect 314"), and a cap structure 313. The substrate structure 312 can include circuitry 324 and a substrate 326 (e.g., a wafer) with a via 327 lined with a dielectric material 330. Conductive material 323 (e.g., a metal layer) can electrically connect the through-silicon via 340 and the cap structure 313, and conductive via 325 (e.g., a metal via) can electrically connect the circuitry 324 and the cap structure 313. A dielectric material 329 can be located between the cap structure 313 and the circuitry 324. The interconnect 314 can include a through-silicon via 340 (TSV 340) and at least one internal stress-relief feature 342. The TSV 340 extends from a first or active side 337 toward a back side 343. The stress-relief feature 342 can be an annular stress-relief feature with an axis of symmetry 339 that is generally aligned with a via axis 341 of the TSV 340. The stress-relief feature 342 can eliminate or manage internal stresses in components of the semiconductor device 310 as discussed in connection with the stress-relief feature 218 of FIGS. 5-10H.

The TSV 340 can include a conductive core 349, spacer material 360, and a seed material 374. The core 349 has an end portion 353 including an inner region 351 and an outer region 352. The stress-relief feature 342 is between the inner and outer regions 351, 352 and can at least partially accommodate thermal expansion of the inner and outer regions 351, 352. The depth D and width W of the stress-relief feature 342 can be increased or decreased to increase or decrease the size s of a stress-relieved region 370 of the semiconductor device 310. The spacer material 360 defines a bottom 347 of the stress-relief feature 342 and can comprise conductive material to provide high electrical conductivity.

FIGS. 12A-12I are schematic cross-sectional views illustrating various stages in a method of manufacturing the semiconductor device 310. Many stages of the manufacturing process discussed with reference to FIGS. 10A-10H can apply to the manufacturing processes of FIGS. 12A-12I. For example, CVD, PVD, plating processes (e.g., electrolytic plating, electroless plating, immersion plating, etc.), filling processes, or other processes can be used to apply the materials and/or layers discussed in connection with FIGS. 12A-12I.

Figure 12A:
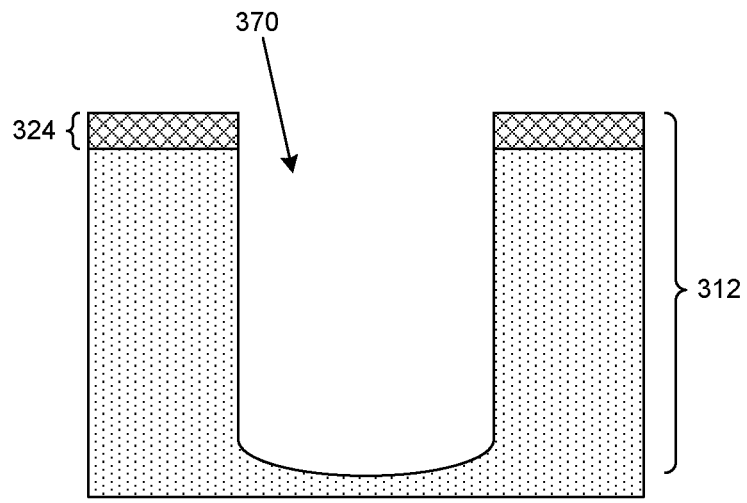
FIGS. 12A-12I are schematic cross-sectional views illustrating various stages in a method of manufacturing a semiconductor device in accordance with an embodiment of the present technology.
Figure 12B:
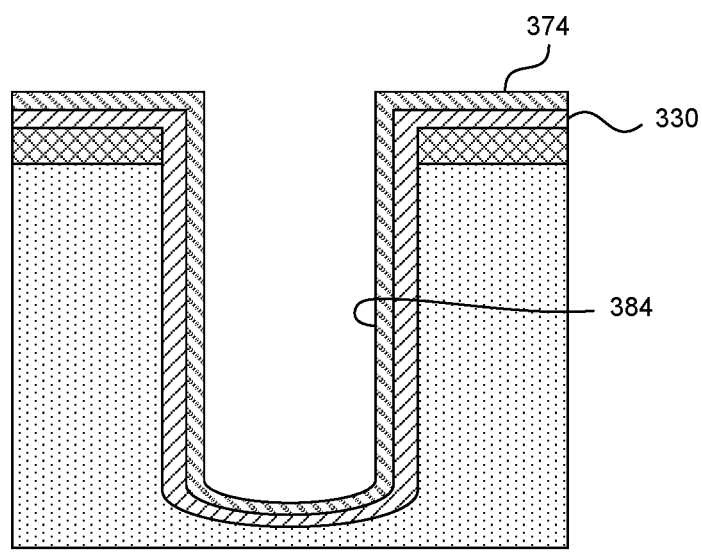
Figure 12C:
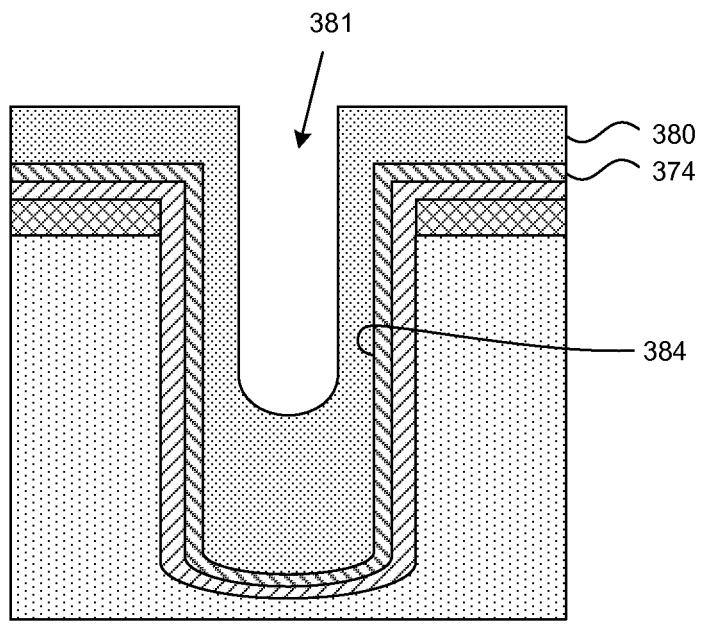
Figure 12D:
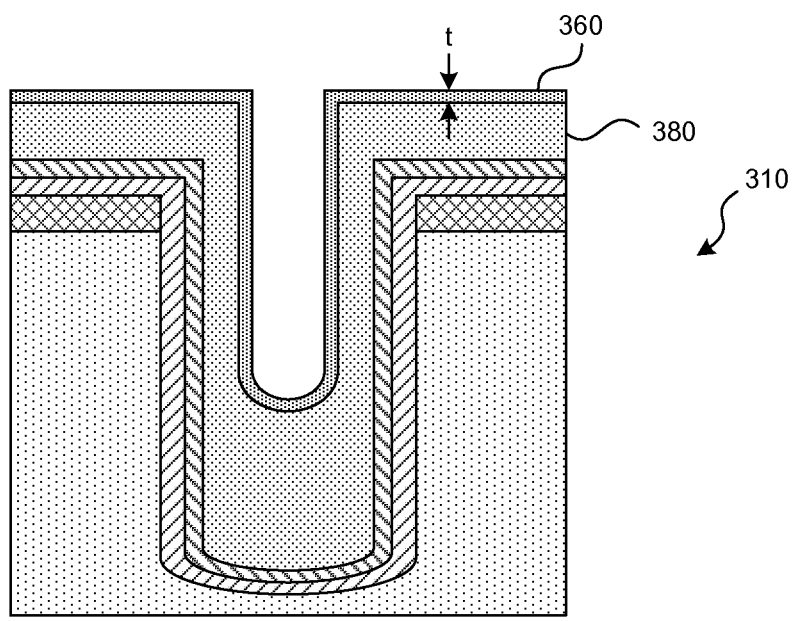
Figure 12E:
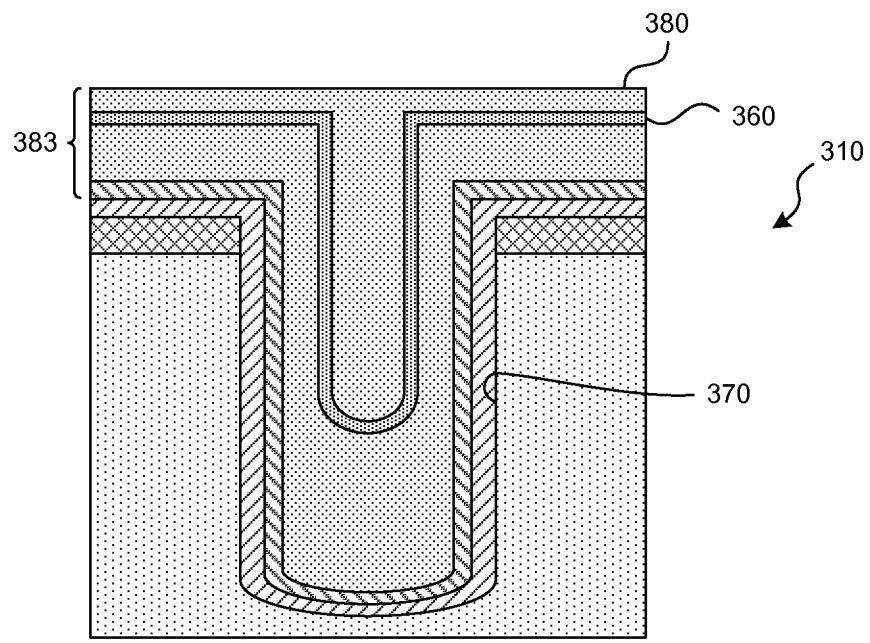
Figure 12F:
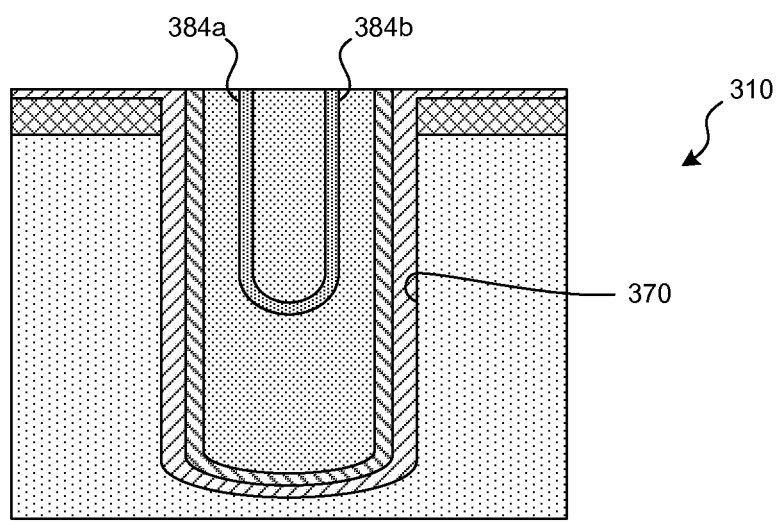
Figure 12G:
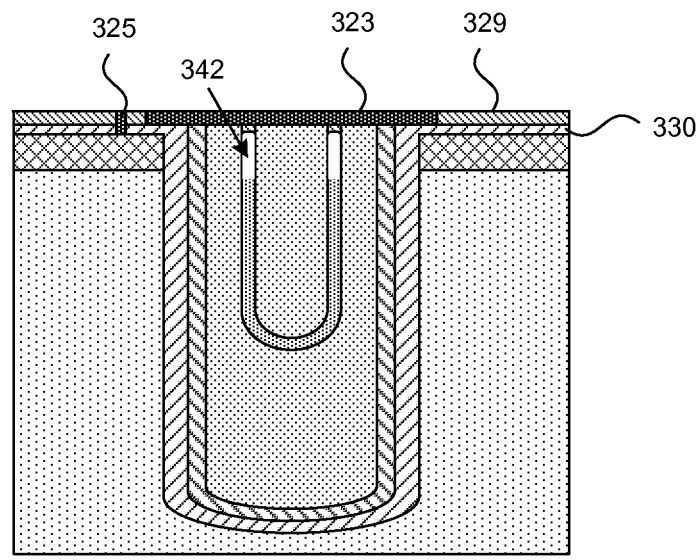
Figure 12H:
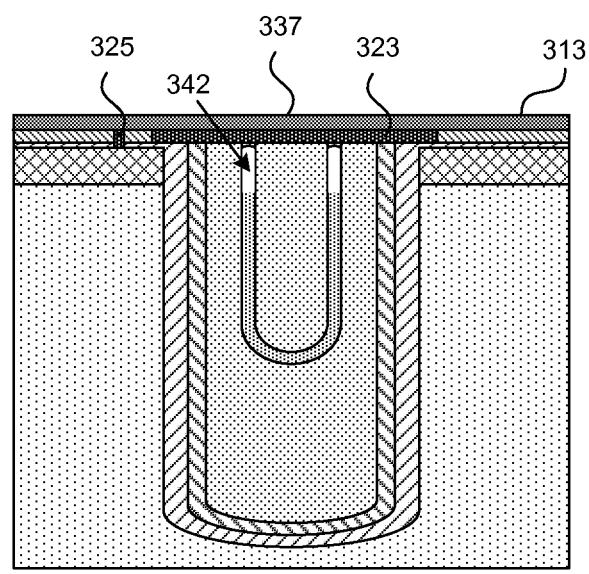
Figure 12I:
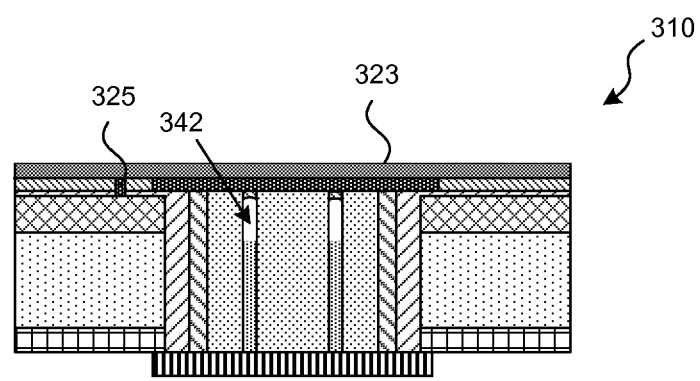

FIG. 12A shows the substrate structure 312 after a blind opening 370 has been formed in the substrate material, and FIG. 12B shows the substrate structure 312 after a barrier material 372 and a seed material 374 have been deposited. FIG. 12C shows the process after a conductive material 380 has been deposited on the seed material 374 to only partially fill the opening 370. A CVD process can be used to deposit the conductive material 380 and form a cavity 381 in the conductive material 374. In some processes, the conductive material 380 can be conformally deposited on a side wall 384 of the seed material 374. FIG. 12D shows the semiconductor device 310 after a spacer material 360 has been applied to the conductive material 380. The thickness t of the spacer material 360 can be increased or decreased to increase or decrease the width (e.g., width W of FIG. 11) of the stress-relief feature 342. FIG. 12E shows the semiconductor device 310 after additional conductive material 380 has been deposited on the spacer material 360, and FIG. 12F shows the semiconductor device 310 after material 383 (FIG. 12E) outside the via 370 has been removed. The upper regions 384a, 384b of the spacer material 360 can be selectively etched to form the stress-relief feature 342 of FIG. 12G. A dielectric material 329 can be deposited and selectively removed. A conductive material can be deposited to form the via 325 and conductive material 323. The conductive material 323 can be continuous or segmented. The dielectric material 329 and/or dielectric material 372 can help seal the seams along the stress-relief feature 342. FIG. 12H shows the semiconductor device 310 after a cap structure 313 covering the conductive material 323, via 325, and dielectric material 329 has been formed, and FIG. 12I shows the semiconductor device 310 after fabrication of the backside of the TSV 340.

FIGS. 13A-13I are schematic cross-sectional views illustrating various stages in a method of manufacturing a semiconductor device in accordance with another embodiment. Many stages of the manufacturing processes of FIGS. 10A-10H and 12A-12I can be used with the manufacturing processes of FIGS. 13A-13I. FIG. 13A shows a substrate structure 412 after a blind opening 411 has been formed in the substrate material, and FIG. 13B shows the substrate structure 412 after a dielectric material 414 has been deposited. FIG. 13C shows the substrate structure 412 after portions of the dielectric liner 414 positioned outside the opening 411 have been removed by a CMP process or other material removal process. The CMP processing can be optional, and the dielectric liner can be kept, or removed after metal CMP processing. FIG. 13D shows the substrate structure 412 after barrier material 416 has been deposited on the dielectric liner 414. FIG. 13E shows the substrate structure 412 after a seed materials 424 has been deposited on the barrier material 416. FIG. 13F shows the substrate structure 412 after a conductive material 428 has been applied to the seed material 424 using, for example, a bottom-up plating technique. FIG. 13G shows the substrate structure 412 after conductive material 428 has been applied using a conformal plating techniques and heat treatments, such as annealing. FIG. 13H shows the substrate structure 412 after depositing material 430 on the conductive material 428 to form an elongated stress-relief feature 444. In some embodiments, a CVD process is used to line a sidewall 451 and to close an upper region of the via. In some embodiments, the material 430 can form a closed top end 450 and a closed bottom end 452 of the stress-relief feature 444. Other processes can be used to form the stress-relief feature 444.

FIG. 13I shows a semiconductor device after material outside of the opening 411 has been removed. A metal TSV 456 of FIG. 13I can include the material 428, 430 and conductive cap structure material (e.g., a bond pad 502 over material 428, 430 of the TSV, fabricated within an interconnect dielectric layer 503). The stress-relief feature 444 can accommodate thermal expansion and/or thermal contraction along most of the length $L_{TSV}$ of the TSV 456, thereby inhibit or limiting stresses in a stress-relieved region 482 of the substrate structure 412. The stress-relief feature 444 can have a depth D that is equal to or greater than about half the length $L_{TSV}$ of the TSV 456 to accommodate thermal expansion along most of the length $L_{TSV}$. A ratio of the depth D to length $L_{TSV}$ can be equal to or greater than about 0.4, 0.5, 0.75, 0.8, and 0.9. Other ratios can also be used, if needed or desired. The stress-relief feature 444 can be positioned along a via axis 459 of the TSV 456. For example, the stress-relief feature 444 can have a longitudinal axis that is aligned (e.g., parallel) with the via axis 459. Backside material can be removed to expose the TSV 456.

The manufacturing method of FIGS. 13A-13I can be modified to achieve desired mechanical and electrical characteristics. In some embodiments, the material 430 can be dielectric material with a CTE that is lower than a CTE of the conductive material 428. The dielectric material 430 can reduce expansion/contraction of the TSV 456 but may decrease the electrical conductivity of the TSV 456. In other embodiments, the material 430 can include a first material 492 (illustrated in phantom line in FIG. 13H) and a second material 494. The first material layer 492 can comprise conductive material, and the second material 494 can comprise dielectric material. The number, thicknesses, and composition of layers can be selected to achieve the desired electrical properties while managing thermal-mechanical stresses.

Figure 14:
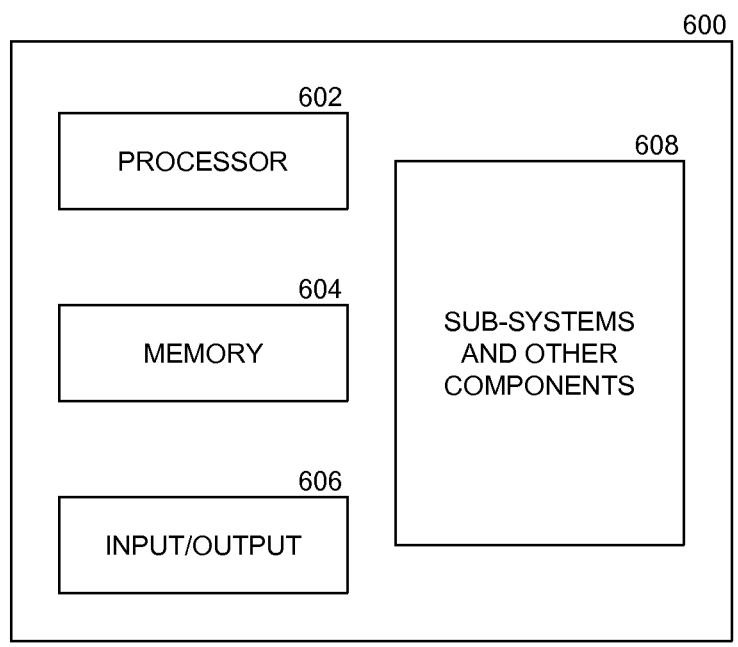
FIG. 14 is a schematic illustration of a system that can include one or more semiconductor devices with stress-relief features in accordance with embodiments of the present technology.

Any of semiconductor structures and their features described above with reference to FIGS. 5-13I can be incorporated into a myriad of larger and/or more complex systems, a representative example of which is a system 600 shown schematically in FIG. 14. The system 600 can include a processor 602, a memory 604 (e.g., SRAM, DRAM, Flash memory and/or other memory device), input/output devices 606 (e.g., a sensor and/or transmitter), and/or other subsystems or components 608. Semiconductor packages having any one or a combination of the features described above with reference to FIGS. 5-13I may be included in any of the devices shown in FIG. 14. For example, the semiconductor packages can include a stack of semiconductor structures with TSVs described in connection with FIGS. 5-13I. The resulting system 600 can perform any of a wide variety of computing, processing, storage, sensing, imaging, and/or other functions. Accordingly, the representative system 600 can include, without limitation, computers and/or other data processors, for example, desktop computers, laptop computers, internet appliances, hand-held devices (e.g., wearable computers, cellular or mobile phones, personal digital assistants, music players, cameras, tablets, etc.), multi-processor systems, processor-based or programmable consumer electronics, network computers and mini-computers. When the temperature of the devices increases during normal use, the stress-relief features can manage thermal expansion/contraction for reliable operation. Other representative systems 600 may be housed in a single unit or distributed over multiple interconnected units (e.g., through a communication network). The components of the system 600 can accordingly include local and/or remote memory storage devices and any of a wide variety of computer-readable media.

From the foregoing, it will be appreciated that specific embodiments of the invention have been described herein for purposes of illustration, but well-known structures and functions have not been shown or described in detail to avoid unnecessarily obscuring the description of at least some embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Certain aspects of the technology described in the context of particular embodiments may be combined or eliminated in other embodiments. Embodiments disclosed herein can be used in chip-to-wafer assemblies, chip-to-chip assemblies, chip-to-substrates, or the like. For example, chips or circuitry can be electrically connected to the TSVs discussed in connection with FIGS. 5-13I. A wide range of packages and electronic devices (e.g., cell phones, computer, etc.) that generate heat can include the embodiments disclosed herein. In some embodiments, a conductive interconnect can include a TSV and an opening, no portion thereof extending completely through the TSV. The opening can be a U-shaped annular stress-relief feature or an elongated stress-relief feature positioned along an axis of the TSV. Additionally, conductive interconnects can include multiple stress-relief features. For example, a TSV can include an annular stress-relief feature discussed in connection with FIGS. 5-12I and an elongated stress-relief feature discussed in connection with FIGS. 13A-13I. The embodiments disclosed herein can be used in large scale production. For example, an array of spaced apart interconnect assemblies can be formed along a substrate structure and processed using back-end-of-line (BEOL) processing, including high temperature BEOL processing. After forming the desired structures (e.g., stacked structures), the structure(s) can be singulated and the individual structures can be packaged. While advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly described or shown herein.

The invention claimed is:

1. A semiconductor device, comprising:
   a substrate structure having a first side, a second side, and a thickness, wherein the substrate structure includes circuitry at the first side and a semiconductor substrate; and
   a conductive interconnect extending through at least a portion of the substrate structure, the conductive interconnect including—
      a through-silicon via extending from the first side toward the second side and including a conductive core and a spacer material, wherein the spacer material is conductive and different from conductive material of the conductive core,
      a stress-relief feature is a closed empty chamber positioned within the conductive core and has sides defined by exposed surfaces of the conductive core, wherein a first end of the stress-relief feature is proximate to and closer to the first side of the substrate structure than a bottom of the substrate,
   wherein at least a portion of the spacer material extends across and defines a second end of the stress-relief feature and is positioned directly between the second end and the second side of the substrate,
   wherein an outermost side portion of the conductive core is positioned radially outward, relative to a via axis of the through-silicon via, of the stress-relief feature and is positioned directly between the stress-relief feature and the circuitry, and
   wherein the stress-relief feature has a depth, relative to the first side of the substrate, greater than twice a thickness of the circuitry such that the stress-relief feature accommodates (a) thermal expansion and/or thermal contraction of the outermost side portion of the conductive material and (b) thermal expansion and/or thermal contraction of the circuitry, wherein the depth is less than the thickness of the substrate.

2. The semiconductor device of claim 1 wherein the semiconductor substrate has a first coefficient of thermal expansion, wherein the conductive material of the through-silicon via has a second coefficient of thermal expansion that is different than the first coefficient of thermal expansion, and wherein the stress-relief feature is a gap configured to be:
   (a) narrowed by thermal expansion of the through-silicon via; and/or
   (b) widened by thermal contraction of the through-silicon via.

3. The semiconductor device of claim 1, further including a liner material between the through-silicon via and the substrate structure, wherein the through-silicon via includes the conductive core.

4. The semiconductor device of claim 1 wherein a portion of the through-silicon via is positioned between the stress-relief feature and the second side of the substrate structure.

5. The semiconductor device of claim 1 wherein the depth of the stress-relief feature in a direction parallel to the via axis is less than a longitudinal length of the through-silicon via.

6. The semiconductor device of claim 1 wherein the stress-relief feature has a width equal to or greater than a distance of thermal expansion of the conductive material caused by a temperature increase of about 200 Celsius.

7. The semiconductor device of claim 1 wherein the stress-relief feature is dimensioned to accommodate thermal expansion and/or thermal contraction of the through-silicon via to inhibit fracturing of material of the substrate structure surrounding the through-silicon via when a temperature of the through-silicon via is increased from room temperature to about 200 Celsius.

8. The semiconductor device of claim 1 wherein the conductive interconnect is a first conductive interconnect and the stress-relief feature is a first stress-relief feature, and the semiconductor device further includes
   a second conductive interconnect that includes a second stress-relief feature, wherein the first stress-relief feature and the second stress-relief feature cooperate to inhibit thermal stresses in the substrate structure caused by thermal expansion and/or thermal contraction of the first and second conductor interconnects to prevent forming a crack that extends from the first conductive interconnect to the second conductive interconnect.

9. The semiconductor device of claim 1 wherein the stress-relief feature is a U-shaped annular recess with an axis of symmetry substantially aligned with the longitudinal axis of the through-silicon via.

10. The semiconductor device of claim 1, wherein the stress-relief feature is an etched gap.

11. A semiconductor assembly, comprising:
    a substrate structure having a first side and a second side and comprising semiconductor material and circuitry at the first side;
    a first conductive interconnect extending through a first portion of the substrate structure and including—
       a first through-silicon via extending from the first side toward the second side and comprising a conductive material and a spacer material different from the conductive material, and
       a first stress-relief feature positioned within the conductive material to accommodate thermal expansion and/or thermal contraction of an outer portion of the conductive material that causes stress in the substrate structure, the outer portion is located directly between the circuitry and the first stress-relief feature and is laterally adjacent to a dielectric material between the first through-silicon via and the substrate structure, a surface of the outer portion defines a side of the first stress-relief feature having a first depth that is (a) less than half of a longitudinal length of the first through-silicon via and (b) at least twice a thickness of the circuitry, wherein at least a portion of the spacer material is positioned directly between the stress-relief feature and the second side and extends across most of a width of an empty chamber of the stress-relief feature; and
    a second conductive interconnect extending through a second portion of the substrate structure and being spaced apart from the first conductive interconnect, the second conductive interconnect including—
       a second through-silicon via extending from the first side toward the second side, and
       a second stress-relief feature positioned within conductive material of the second through-silicon via to accommodate thermal expansion and/or thermal contraction of the second through-silicon via and having a second depth that is less than half of a longitudinal length of the second through-silicon via.

12. The semiconductor assembly of claim 11 wherein the substrate structure has a first surface facing the first conductive interconnect and a second surface facing the second conductive interconnect, wherein the first stress-relief feature and the second stress-relief feature are configured to accommodate thermal expansion and/or thermal contraction of the first and second through-silicon vias, respectively, to prevent forming a crack that extends between the first and second surfaces of the substrate structure.

13. The semiconductor assembly of claim 11 wherein the first stress-relief feature is an annular gap.

14. A method of manufacturing a semiconductor device, the method comprising:
forming a conductive interconnect extending from a first side of a substrate structure toward a second side of the substrate structure; and
removing a spacer material located between a conductive core of the conductive interconnect and circuitry of the substrate structure to form a stress-relief feature of the conductive interconnect, wherein the spacer material is conductive and different from conductive material of the conductive core, wherein the stress-relief feature is an empty gap positioned within the conductive interconnect to compensate for thermal expansion and/or thermal contraction of a portion of conductive material of the conductive interconnect laterally adjacent to a portion of the circuitry, wherein the portion of conductive material is directly between the portion of the circuitry at the first side of the substrate structure and the stress-relief feature and an exposed surface of the portion defines a side of the first stress-relief feature, wherein the portion of conductive material extends outwardly from a via axis and across most of a distance between the stress-relief feature and the first side of the substrate structure, and wherein the stress-relief feature has a depth that is less than a thickness of the substrate structure such that conductive material of the through-silicon via is positioned between the stress-relief feature and a second side of the substrate structure.

15. The method of claim 14, further comprising forming a cap structure that covers the stress-relief feature.

16. The method of claim 14, further comprising a dielectric material between the portion of conductive material and the portion of the circuitry.

17. A semiconductor device comprising:
a substrate structure including circuitry and a semiconductor, wherein the substrate structure has a first side, a second side, and a thickness, wherein the circuitry is at the first side;
a liner material; and
a conductive interconnect extending through at least a portion of the substrate structure, the conductive interconnect including
a through-silicon via extending from the first side toward the second side and including a conductive core and a conductive spacer material, wherein the conductive spacer material is different from material of the conductive core and is positioned between the conductive core and the liner material, and
a stress-relief gap that accommodates thermal expansion and/or thermal contraction of the conductive core, wherein a first end of the stress-relief gap is proximate to and closer to the first side of the substrate structure than a bottom of the substrate and a portion of the conductive core is laterally adjacent the liner material and directly between the stress-relief gap and the circuitry such that the conductive core defines opposing sides of the stress-relief gap and the conductive spacer material defines a bottom of the stress-relief gap.

* * * * *